United States Patent
Fukui et al.

(10) Patent No.: US 10,221,076 B2
(45) Date of Patent: Mar. 5, 2019

(54) METHOD FOR PRODUCING A PLATE-LIKE ALUMINA POWER

(71) Applicant: NGK INSULATORS, LTD., Nagoya (JP)

(72) Inventors: Hiroshi Fukui, Obu (JP); Kei Sato, Tokai (JP); Morimichi Watanabe, Nagoya (JP); Tsutomu Nanataki, Toyoake (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 15/446,539

(22) Filed: Mar. 1, 2017

(65) Prior Publication Data

US 2017/0174524 A1   Jun. 22, 2017

Related U.S. Application Data

(63) Continuation of application No. PCT/JP2016/078382, filed on Sep. 27, 2016.

(30) Foreign Application Priority Data

Sep. 27, 2016   (JP) ................. 2015-193942

(51) Int. Cl.
   *C01F 7/02*   (2006.01)
   *C01F 7/30*   (2006.01)
   (Continued)

(52) U.S. Cl.
   CPC ............... *C01F 7/021* (2013.01); *C01F 7/30* (2013.01); *C01F 7/441* (2013.01); *C01F 7/442* (2013.01);
   (Continued)

(58) Field of Classification Search
   CPC . C01F 7/021; C01F 7/30; C30B 1/026; C30B 1/10; C30B 29/20; C30B 33/00
   See application file for complete search history.

(56) References Cited

U.S. PATENT DOCUMENTS

| 4,847,064 A | 7/1989 | Pearson |
| 5,538,709 A | 7/1996 | Mohri et al. |

(Continued)

FOREIGN PATENT DOCUMENTS

| EP | 0429548 B1 * | 4/1996 | ............... C01F 7/14 |
| JP | 04-500947 A1 | 2/1992 | |

(Continued)

OTHER PUBLICATIONS

Charles A. Shaklee, et al., "Growth of $\alpha$-$Al_2O_3$ Platelets in the HF-$\gamma$-$Al_2O_3$ System," *Journal of American Ceramic Society*, vol. 77, No. 11, 1994, 2977-2984.

(Continued)

*Primary Examiner* — James A Fiorito
(74) *Attorney, Agent, or Firm* — Burr & Brown, PLLC

(57) ABSTRACT

A plate-like alumina powder production method of the present invention comprises placing a transition alumina and a fluoride in a container such that the transition alumina and the fluoride do not come into contact with each other and then performing heat treatment to obtain a plate-like $\alpha$-alumina powder. The transition alumina is preferably at least one selected from the group consisting of gibbsite, boehmite, and $\gamma$-alumina. It is preferable that the amount of the fluoride used is set such that the percentage ration of F in the fluoride to the transition alumina is 0.17% by mass or more. The container preferably has a volume such that a value obtained by dividing the mass of F in the fluoride by the volume of the container is $6.5 \times 10^{-5}$ g/cm$^3$ or more. The heat treatment is preferably performed at the temperature of 750 to 1,650° C.

9 Claims, 4 Drawing Sheets

(51) Int. Cl.
*C30B 1/02* (2006.01)
*C30B 1/10* (2006.01)
*C30B 29/20* (2006.01)
*C30B 33/00* (2006.01)
*C01F 7/44* (2006.01)
*C04B 35/111* (2006.01)
*C04B 35/115* (2006.01)
*C04B 35/626* (2006.01)

(52) U.S. Cl.
CPC ........... *C04B 35/111* (2013.01); *C04B 35/115* (2013.01); *C04B 35/6261* (2013.01); *C04B 35/62675* (2013.01); *C30B 1/026* (2013.01); *C30B 1/10* (2013.01); *C30B 29/20* (2013.01); *C30B 33/00* (2013.01); *C01P 2004/03* (2013.01); *C01P 2004/22* (2013.01); *C01P 2004/24* (2013.01); *C01P 2004/54* (2013.01); *C01P 2004/61* (2013.01); *C01P 2004/62* (2013.01); *C01P 2006/80* (2013.01); *C04B 2235/3217* (2013.01); *C04B 2235/445* (2013.01); *C04B 2235/5292* (2013.01); *C04B 2235/5296* (2013.01); *C04B 2235/5436* (2013.01); *C04B 2235/72* (2013.01); *C04B 2235/787* (2013.01)

(56) References Cited

U.S. PATENT DOCUMENTS

| 6,015,456 | A | 1/2000 | Fukuda et al. |
| 2002/0155944 | A1 | 10/2002 | Kurashina et al. |
| 2006/0153769 | A1 | 7/2006 | Robinson et al. |
| 2011/0052485 | A1 | 3/2011 | Seo et al. |
| 2015/0315442 | A1 | 11/2015 | Hofius |

FOREIGN PATENT DOCUMENTS

| JP | 06-329412 A1 | 11/1994 | |
| JP | 2916664 B2 | 7/1999 | |
| JP | 2002/293609 A1 | 10/2002 | |
| JP | 3744010 B2 | 2/2006 | |
| JP | 37589208 B2 | 3/2006 | |
| JP | 4749326 B2 | 8/2011 | |
| JP | 5255059 B2 | 8/2013 | |
| WO | WO96/21619 | * 7/1996 | ................ C01F 7/22 |
| WO | 2009/028887 A2 | 3/2009 | |
| WO | 2014/102249 A1 | 7/2014 | |

OTHER PUBLICATIONS

Mitsuo Shimbo, et al., "Influence of Addiciton of $AlF_3$ on Thermal Decomposition of Gibbsite and Phase Transition of the Intermediate Alumina to $\alpha\text{-}Al_2O_3$," *Journal of the Ceramic Soicety of Japan*, vol. 115, No. 9, 2007, pp. 536-540.

International Search Report and Written Opinion (Application No. PCT/JP2016/078382) dated Nov. 1, 2016.

English Translation of International Preliminary Report on Patentability, International Application No. PCT/JP2016/078382, dated Apr. 12, 2018 (10 pages).

* cited by examiner

METHOD FOR PRODUCING A PLATE-LIKE ALUMINA POWER

BACKGROUND OF THE INVENTION

1. Field of the Invention

The present invention relates to a method for producing a plate-like alumina powder.

2. Description of the Related Art

PTL 1 discloses an oriented alumina sintered body produced using a plate-like alumina powder as part of raw materials and shows that the orientation of the alumina sintered body improves corrosion resistance and heat resistance. However, to obtain high corrosion resistance and heat resistance, it is necessary to reduce the amount of impurities in the sintered body, and there is a need for a plate-like alumina powder with higher purity, in order to achieve a further improvement in these properties.

A high-purity dense alumina sintered body is known to have optical translucency. PTL 2 discloses optical translucency of a ceramic polycrystal having a triclinic, monoclinic, orthorhombic, tetragonal, trigonal, or hexagonal crystal structure. PTL 2 shows that an oriented alumina sintered body produced using a plate-like alumina powder as part of raw materials can have sufficient heat resistance and high in-line transmittance. However, it is generally known that, to achieve high optical translucency in an alumina sintered body, the purity of the alumina sintered boy must be high. Therefore, a high-purity plate-like alumina powder is needed. For example, methods described in PTL 3 to PTL 6 and NPL 1 are known as methods for producing a plate-like alumina powder.

CITATION LIST

Patent Literature

PTL 1: JP 2916664 B
PTL 2: JP 2002-293609 A
PTL 3: JP 3759208 B
PTL 4: JP 4749326 B
PTL 5: JP 5255059 B
PTL 6: JP 3744010 B

Non-Patent Literature

NPL 1: J. Am. Ceram. Soc., 77[11]2977-84 (1994)

SUMMARY OF THE INVENTION

However, in PTL 3, impurities remain in the plate-like alumina powder during its production due to the influence of additives etc., so that it is not possible to obtain a high-purity plate-like alumina powder. In the methods described in PTL 4 and PTL 5, after the plate-like alumina powder is synthesized, additives etc. are removed through a washing step etc. However, these methods are insufficient to obtain a high purity of 99.9% by mass or more. In PTL 6, it is necessary to introduce a hard-to-handle halogen or hydrogen halide gas into an atmosphere gas used when transaction alumina is fired. NPL 1 discloses a method for producing a plate-like alumina powder using a HF solution and a γ-alumina powder or a boehmite powder. However, it is necessary to use the hard-to-handle HF solution. The method in NPT 1 includes the step of treating the surface of the γ-alumina powder with the HF solution. When the amount of the powder treated is large, the treated state of the γ-alumina powder may be nonuniform, and this may influence the particle size and shape of the plate-like alumina. Therefore, when a large amount of the plate-like alumina powder is produced, it is necessary to perform the HF treatment in multiple steps, and this causes problems in regard to workability and production cost. The synthesized plate-like alumina powder may contain large aggregates. To obtain a powder with no aggregates, it is necessary to perform disintegration treatment for a long time.

The present invention has been made to solve the above problems, and it is a main object to obtain a high-purity plate-like alumina powder in a simple manner without using hard-to-handle gases and solutions.

The plate-like alumina powder production method of the present invention comprises:

preparing a fluoride and at least one transition alumina selected from the group consisting of gibbsite, boehmite, and γ-alumina; setting the amount of the fluoride used such that the percentage ratio of F in the fluoride to the transaction alumina is 0.17% by mass or more; preparing a container having a volume such that a value obtained by dividing the mass of the F in the fluoride by the volume of the container is $6.5 \times 10^{-5}$ g/cm$^3$ or more; placing the transition alumina and the fluoride in the container such that the transaction alumina and the fluoride do not come into contact with each other; closing the container; and then performing heat treatment at 750 to 1,650° C. to thereby obtain a plate-like α-alumina powder.

With the plate-like alumina powder production method of the present invention, a high-purity plate-like alumina powder composed of plate-like α-alumina particles can be obtained n a simple manner without using a hard-to-handle HF solution and hard-to-handle halogen and hydrogen halide gases.

In this production method, the reaction mechanism that allows the plate-like α-alumina particles to be obtained from the transition alumina is not clear, but the reaction of the transition alumina and the fluoride may be involved. To allow the formation of the plate shape and the transformation to the α-alumina to proceed, it is necessary to close the container so that the heat treatment is performed with a certain amount of gas components confined in the container, and this may indicate that the gas components contribute to the reaction. Therefore, it may be possible that moisture in the atmosphere and water vapor generated from moisture contained in the transition alumina etc. also contribute to the reaction. In view of the above, the heat treatment atmosphere is preferably air or an inert atmosphere and particularly preferably air.

DETAILED DESCRIPTION OF THE INVENTION

Figure 1A:
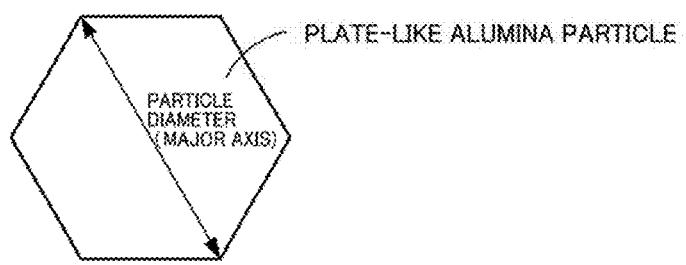
FIGS. 1A and 1B show schematic diagrams of a plate-like α-alumina particle, FIG. 1A being a plan view, FIG. 1B being a front view.

In the plate-like alumina powder production method of the present invention, a fluoride and at least one transition alumina selected from the group consisting of gibbsite, boehmite, and γ-alumina are prepared, and the amount of the fluoride used is set such that the percentage ratio of F in the fluoride to the transition alumina is 0.17% by mass or more. A container is prepared which has a volume such that a value obtained by dividing the mass of the F in the fluoride by the volume of the container is $6.5 \times 10^{-5}$ g/cm$^3$ or more, and the transition alumina and the fluoride are placed in the container such that the transition alumina and the fluoride do not come into contact with each other. The container is closed, and then heat treatment is performed at 750 to 1,650° C. to thereby obtain a plate-like α-alumina powder.

In the production method of the present invention, the transition alumina is at least one elected from the group consisting of gibbsite, boehmite, and γ-alumina. The use of such a transition alumina allows plate-like α-alumina particles to be obtained through the heat treatment. When bayerite is used instead of the above transition aluminas, granular alumina particles or δ-alumina may be present as an admixture after the heat treatment. It is preferable that the transition alumina used is a high-purity product. This is because the use of the high-purity product allows a high-purity plate-like alumina powder to be obtained through the heat treatment. For example, the mass ratios of elements other than Al, O, F, H, C, and S are preferably 1,000 ppm or less, more preferably 100 ppm or less, and still more preferably 10 ppm or less.

In the production method of the present invention, α-alumina particles may be added as seed crystals to the transition alumina. This is because of the following reason. The α-alumina particles serve as nuclei in the initial stage of the heat treatment, and this facilitate the transformation of the alumina particles to α-alumina particles, so that the plate-like alumina powder obtained has a uniform particle diameter. There is a tendency that the thicknesses of the plate-like alumina particles are determined depending on the diameters of the α-alumina particles. For example, the average diameter D50 of the α-alumina particles may be 0.1 to 16 μm. As the average diameter of the α-alumina particles decreases, the aspect ratio of the plate-like alumina particles tends to increase. In terms of synthesizing plate-like alumina particles with a high-aspect ratio, the average diameter of the α-alumina particles is preferably 0.5 μm or less and more preferably about 0.1 μm. In terms of obtaining plate-like alumina having a large particle diameter, it is preferable that the amount of the α-alumina particles externally added to the total mass of the transition alumina and the fluoride is small. The amount of the α-alumina particles externally added is preferably 4.2% by mass or less and more preferably 1.5% by mass or less. In terms of obtaining plate-like alumina having a uniform particle diameter, it is preferable that the amount of the α-alumina particles is preferably 0.01% by mass or more and more preferably 0.1% by mass or more. To achieve a large particle diameter and a uniform particle diameter simultaneously, the amount of the α-alumina particles added is preferably within the range of 0.01% by mass to 4.2% by mass and more preferably within the range of 0.1% by mass to 1.5% by mass. As the amount of the seed crystals added increases, the diameters of the plate-like alumina particles tend to decrease. In terms of reducing the diameters of the plate-like alumina particles, it is preferable that the amount of the α-alumina particles added is large. The amount of the α-alumina particles added is preferably 1% by mass or more and preferably 3% by mass or more. As the amount of the α-alumina particles added increases, the aspect ratio of the plate-like alumina particles obtained decreases. In terms of increasing the aspect ratio of the plate-like alumina particles, the amount of the α-alumina particles added is preferably 30% by mass or less.

Plate-like alumina particles may be used as the seed crystals. When α-alumina formed into a plate shape in advance is used as the seed crystals, the diameters (major axes) of plate surfaces of the synthesized plate-like alumina particles become large, and the aspect ratio can be increased. In particular limitation is imposed on the thicknesses of the plate-like alumina particles added and the diameters of their plate surfaces. To obtain plate-like alumina particles with a high aspect ratio, it is preferable to use a high-aspect ratio powder added as the seed crystals. In terms of obtaining high-purity plate-like alumina particles, it is preferable that the content of impurity elements in the plate-like alumina particles added as the seed crystals is small. In view of this, it is preferable to add, as the seed crystals, the plate-like alumina particles produced by the method of the present invention.

In the production method of the present invention, no particular limitation is imposed on the fluoride, so long as it is a compound containing fluorine. Examples of the fluoride include: compounds of F and group II elements such as $MgF_2$ and $CaF_2$; compounds of F and rare-earth elements such as $YF_3$; compounds of F and transition metals such as $FeF_3$; compounds of F and Al; and an ammonium salt of fluorine ($NH_4F$). When a fluoride containing a metal element is used, it is preferable that the fluoride has a high melting point, and a compound having a melting point of 900° C. or higher is preferable. This is because such a fluoride resists evaporation and the metal element serving as an impurity is less likely to be mixed into in the synthesized plate-like alumina. When a fluoride containing no metal element, such as $NH_4F$, is used, no metal element is mixed as impurities into the plate-like alumina powder, which is preferable. From the above point of view, fluorides such as fluorides of rare-earth elements, compounds of F and Al, and $NH_4F$ are preferable. Of these, compounds of F and Al are preferable, and $AlF_3$ is particularly preferable. No particular limitation is imposed on the form of the fluoride, and the fluoride may be fine particles, in a flake form, a fiber form, a membrane form, or a bulk form.

In the production method of the present invention, it is preferable that the amount of the fluoride used is set such that the percentage ratio of F in the fluoride to the transition alumina is 0.17% by mass or more. This is because, if the percentage ratio is less than 0.17% by mass, the alumina particles obtained through the heat treatment are not formed into a plate shape.

In the production method of the present invention, the container prepared has a volume such that a value obtained by dividing the mass of F in the fluoride by the volume of the container (hereinafter referred to as "the mass of F/the container volume") is $6.5 \times 10^{-5}$ g/cm$^3$ or more. This is because, if the mass of F/the container volume is less than $6.5 \times 10^{-5}$ g/m$^3$, α-alumina is not obtained even when the heat treatment is performed. It is preferable that the mass of F/the container volume is large. This is because the plate-like α-alumina powder can have a more uniform particle shape and a more uniform aspect ratio. No particular limitation is imposed on the upper limited of the mass of F/the container volume. However, if this ratio is excessively large, the amount of a F-containing gas component generated becomes large, and this may cause the corrosion of the apparatus to proceed. In terms of the service life of the apparatus, it is preferable that the ratio is small. For example, the ratio is preferably $1.4 \times 10^{-1}$ g/m$^3$ or less and more preferably $1.4 \times 10^{-2}$ g/cm$^3$ or less. The container used can be, for example, a commonly used crucible or sagger.

In the production method of the present invention, it is not preferable that the container contains a component that volatilizes at the heat treatment temperature or reacts with the alumina component and the F component. It is also not preferable that the material forming the container includes an element that reacts with the F component (e.g., AlF$_3$ gas) and sublimates or includes an element that forms a fluoride with a low boiling point. Therefore, in the material forming the container, it is preferable that the total amount of elements other than Al, O, Mg, Ca, Sr, N, Re (Re: rare-earth elements) is 1% by mass or less. This is because impurity elements originating from the container are less likely to be mixed into the plate-like alumina powder obtained through the heat treatment, and the product obtained has high purity. To further increase the purity, the total amount of the above elements is preferably 0.5% by mass or less and more preferably 0.1% by mass or less. Even when Mg, Ca, Sr, and Re react with the F component to form fluorides, these fluorides have high boiling points and are unlikely to sublimate. However, since Mg. Ca, Sr, and Re may react with the alumina component, some contrivance to prevent direct contact between the container and the raw material powder is necessary, e.g., the powder mixture is placed on an alumina setter. Therefore, the material of the container is preferably Al$_2$O$_3$ with a purity of 99% by mass or more, more preferably Al$_2$O$_3$ with a purity of 99.5% by mass or more, more preferably Al$_2$O$_3$ with a purity of 99.9% by mass or more.

In the production method of the present invention, the transition alumina and the fluoride are placed in the container such that they do not come into contact with each other. No particular limitation is imposed on the manner of placing the transition alumina and the fluoride, so long as they do not come into contact with each other. For example, a small container with the transition alumina placed therein may be placed in a large container, and the fluoride may be placed around the small container within the large container. Alternatively, a small container with the transition alumina placed therein and another small container with the fluoride placed therein may be placed in a large container. In this case, these small containers may be arranged on the bottom of the large container, or one of the small containers may be stacked on the other one. Alternatively, the transition alumina and the fluoride may be placed in one container such that they do not come into contact with each other. By subjecting the transition alumina and the fluoride prevented from coming into contact with each other to heat treatment, a plate-like powder with less aggregates can be obtained. Moreover, even when a fluoride containing a large amount of impurities or a fluoride containing an element other than Al is used, a high-purity plate-like powder can be obtained. The reason that the number of aggregates decreases is not clear. When the transition alumina and the fluoride in contact with each other are subjected to heat treatment, aggregates are likely to be formed around the fluoride.

In the production method of the present invention, after the transition alumina and the fluoride are placed in the container such that they do not come into contact with each other, the container is closed, and then heat treatment is performed. To allow the formation of the plate shape and the transformation to the α-alumina to proceed, it is necessary to close the container. When the container is closed, the container may or may not be sealed. When a sagger, for example, is used as the container, a setter (lid) may be placed on the sagger to close it. In this case, the container is closed with its inner side in communication with the other side, so that the container is not sealed. When the container used is made of a porous material, the transition alumina and the fluoride may be confined in the container. In this case, the inner side of the container is in communication with the outer side through the porous material-made wall of the container, so that the container is not sealed. Alternatively, a dense container may be used, and an opening of the container may be closed by a lid with a packing. A metal-made container may also be used, and an opening of the container may be sealed, for example, by welding. In these causes, the containers are sealed. When the container used is sealed, the internal pressure of the container increases due to the gas generated during heat treatment, so the pressure resistance of the container must be high. Therefore, in terms of workability and manufacturing cost, it is preferable that the container is closed without being sealed (such that its inner side is in communication with the outer side) rather than closed and sealed.

In the production method of the present invention, whether or not the α-alumina particles obtained through the heat treatment are plate-like particles is determined by the aspect ratio of the alumina particles. Specifically, alumina particles with an aspect ratio of 3 or more are judged as being plate-like alumina particles, and alumina particles with an aspect ratio of less than 3 are judged as not being the plate-like alumina particles. The aspect ratio is the average particle diameter/the average thickness. The average particle diameter is the average of the major axes of plate surfaces of the particles, and the average thickness is the average of the minor axes (thicknesses) of the particles.

In the production method of the present invention, the heat treatment temperature is set to 750 to 1,650° C. A heat treatment temperature of lower than 750° C. is not preferable because γ-alumina may remain after the heat treatment. A heat treatment temperature of higher than 1,650° C. is not preferable because the powder obtained has an aspect ratio of less than 3. The heat treatment temperature is preferably 850 to 1,350° C., more preferably 850 to 1,200° C., and most preferably 850 to 1,100° C.

In the production method of the present invention, the plate-like alumina obtained through the heat treatment may be subjected to disintegration treatment. In this case, clusters of aggregated plate-like α-alumina particles can be disintegrated. For example, when the plate-like alumina powder is used as a raw material for producing oriented alumina, the plate-like alumina powder provided can have an appropriate shape. No particular limitation is imposed on the disintegration method. Examples of the disintegration method include a ball mill, a bead mill, a vibration mill, a jet mill, a hammer mill, a pin mill, a pulverizer, a millstone-type mill, a wet atomization apparatus, and other airflow mills and mechanical mills.

In the production method of the preset invention, the plate-like alumina powder obtained through the heat treatment may be subjected to annealing treatment at 500 to 1,350° C. in air or an inert or vacuum atmosphere. The terms "vacuum" means a pressure lower than the atmospheric pressure. During the annealing treatment, air, an inert gas, etc. may be introduced. The annealing treatment performed allows the concentration of impurity elements, particularly F, remaining in the plate-like alumina powder obtained through the heat treatment to be further reduced or lowered to zero. An annealing treatment temperature of lower than 500° C. is not preferable because the concentration of F in the plate-like alumina particles is almost unchanged before and after the annealing treatment. An annealing treatment temperature of higher than 1,350° C. is not preferable because melting of the peripheries of the plate-like alumina particles or sintering of the plate-like alumina particles may occur, causing an excessive reduction in the aspect ratio. To efficiently reduce the concentration of F while the shape of the plate-like alumina particles is maintained, the annealing treatment temperature is preferably 700 to 1,250° C., more preferably 800 to 1,200° C., and still more preferably 900 to 1,150° C. Preferably, the container used for the annealing is made of the same material as the material of the container used for the production of the plate-like alumina particles. Preferably the container used for the annealing has no lid in order to allow impurity elements such as F to easily volatilize. In terms of reducing the impurity elements, the material is preferably $Al_2O_3$ with a purity of 99% by mass or more and more preferably $Al_2O_3$ with a purity of 99.5% by mass or more.

After the annealing treatment, the plate-like alumina may be subjected to disintegration treatment. In this case, clusters of aggregated plate-like α-alumina particles can be disintegrated. For example, when the plate-like alumina powder is used as a raw material for producing oriented alumina, the plate-like alumina powder provide can have a shape suitable for the raw material for producing the oriented alumina. No particular limitation is imposed on the disintegration method. Examples of the disintegration method include a method in which the alumina powder is pressed against a mesh or screen with an opening size of 10 to 100 μm to disintegrate the alumina powder, a ball mill, a bead mill, a vibration mill, a jet mill, a hammer mill, a pin mill, a pulverizer, a millstone-type mill, a wet atomization apparatus, and other airflow mills and mechanical mills.

With the production method of the present invention, the following plate-like alumina powder can be obtained. The plate-like α-alumina particles forming the plate-like alumina powder produced have a crystal face orthogonal to the c axis and grown into a flat plate shape. The average diameter D50 of the plate-like α-alumina particles is 0.3 to 50 μm, and the aspect ratio represented by the diameter of the plate surface of a particle/its thickness is 3 to 500. Such a plate-like alumina powder is suitable for producing an oriented alumina sintered body and does not cause any problem during, for example, tape casting, extrusion, and casting. Preferably, in the plate-like alumina powder, the mass ratios of elements other than Al, O, H, F, C, and S are 10 ppm or less.

The plate-like alumina powder obtained by the production method of the present invention can be used to produce transparent alumina. When a transparent alumina substrate is produced, its sintering behavior varies depending on the amount of F contained ins its raw material, and the properties of the obtained sintered body such as the degree of orientation, optical translucency, and denseness also vary depending on the amount of F. Therefore, when a transparent alumina substrate is produced, it is necessary to control the amount of F remaining in the plate-like alumina powder to an appropriate value, in consideration of the composition of the raw materials of the alumina powder etc.

The amount of F in the plate-like alumina powder obtained by the production method of the present invention can be controlled by controlling the percentage ration of F in the fluoride to the transaction alumina, controlling the heat treatment temperature, or subjecting the obtained plate-like powder to annealing treatment. For example, plate-like alumina containing a large amount of F is obtained by performing the heat treatment with the percentage ratio of F in the fluoride to the transition alumina set to be large or reducing the heat treatment temperature. Plate-like alumina containing a small amount of F is obtained by performing the heat treatment with the percentage ratio of F in the fluoride to the transaction alumina set to be small, increasing the heat treatment temperature, or subjecting the obtained plate-like alumina to annealing treatment.

By controlling the percentage ratio of F in the fluoride to the transaction alumina, the particle diameter, particle thickness, and aggregation amount of the obtained plate-like alumina can be controlled. In terms of increasing the particle diameter, it is preferable to increase the percentage ratio of F in the fluoride to the transition alumina. In terms of increasing the particle thickness and reducing the amount of aggregation, it is preferable to reduce the percentage ratio of F in the fluoride to the transition alumina. When $AlF_3$ is used as the fluoride, it is preferable, in terms of increasing the particle diameter, that the percentage ratio of F in the fluoride to the transition alumina is large. The percentage ratio of F is preferably 0.7% by mass or more and more preferably 2.7% by mass or more. However, when the percentage ratio of F in the fluoride to the transition alumina is increased to 2.7% by mass or more, the effect of increasing the particle diameter is reduced in some cases. In terms of increasing the particle thickness and reducing the amount of aggregation, it is preferable that the percentage ratio of F in the fluoride to the transaction alumina is small. The percentage ratio of F is preferably 2.7% by mass or less and more preferably 1.8% by mass or less. To maintain the aspect ratio of the plate-like alumina to be 3 or more, it is necessary that the percentage ratio of F be 0.17% by mass or more. To achieve a large diameter and a high aspect ratio simultaneously and to reduce the amount of aggregation, the percentage ratio of F in the fluoride to the transition alumina is preferably within the range of 0.7% by mass to 2.7% by mass and more preferably within the range of 1.08% by mass to 2.0% by mass.

EXAMPLES

Figure 1B:
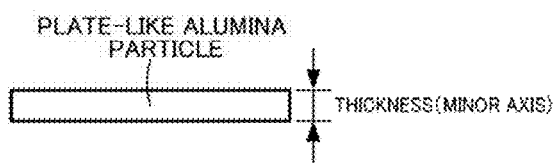

1. Method for Evaluating Alumina Powder (1) Particle Diameter—Thickness—Aspect Ratio The average diameter, average thickness, and aspect ratio of particles contained in each of plate-like alumina powders obtained in Experimental Examples in 2 described later were determined by observing randomly selected 100 particles in the plate-like alumina powder under a scanning electron microscope (SEM). The average diameter is the average of the major axes of the plate surfaces of the particles, and the average thickness is the average of the minor axes (thicknesses) of the particles. The aspect ratio is computed as the average particle diameter/the average thickness. FIGS. 1A and 1B show schematic diagrams of a plate-like α-alumina particle. FIG. 1A is a plan view, and FIG. 1B is a front view. The plate-like α-alumina particle has a substantially hexagonal shape in plan view. Its particle diameter is as shown in FIG. 1A, and the thickness is as shown in FIG. 1B.

(2) Purity

Elements contained in each of the plate-like alumina powders obtained in the Experimental Examples were analyzed quantitatively using the following methods.

C and S: Analysis by a firing (high-frequency heating)-infrared absorption spectroscopy using a carbon-sulfur analyzer (CS844), manufactured by LECO).

N: Analysis by an inert gas fusion-thermal conductivity method using an oxygen-nitrogen analyzer (EMGA-650W, manufactured by HORIBA Ltd.).

H: Analysis by an inert gas fusion-no dispersive infrared absorption spectroscopy using a hydrogen analyzer (EMGA-921, manufactured by HORIBA Ltd.).

F: Analysis by alkali fusion-ion chromatography. 1 to 3 parts by weight of anhydrous sodium carbonate was added to 0.0 to 1 part by weight of the plate-like alumina powder and mixed to homogeneity in a platinum crucible, and the mixture was heated and fused. After allowed to cool, the fused product, together with the crucible, was placed in a beaker containing hot water and heated to completely dissolve soluble salts. The obtained aqueous solution was analyzed by ion chromatography (IC-5000, manufactured by Thermo fisher Scientific K.K.).

Other impurity elements (mainly Si, Fe, Ti, Na, Ca, Mg, K, P, V, Cr, Mn, Co, Ni, Cu, Zn, Y, Zr, Pb, Bi, Li, Be, B, Cl, Sc, Ga, Ge, As, Se, Br, Rb, Sr, Nb, Mo, Ru, Rh, Pd, Ag, Cd, In, Sn, Sb, Te, Cs, Ba, Hf, Ta, W, Ir, Pt, Au, Hg, La, Ce, Pr, Nd, Sm, Eu, Gd, Tb, Dy, Ho, Er, Tm, Yb, and Lu): The plate-like alumina powder was dissolved using a pressurized sulfuric acid decomposition method according to JIS R1649 and then analyzed using an inductively coupled plasma (ICP) emission spectroscopy analyzer (PS3520UV-DD), manufactured by Hitachi High-Tech Science Corporation).

(3) Crystal Phase

The crystal phase of each of the plate-like alumina powders obtained in the Experimental Examples was identified using X-ray diffraction spectra obtained by 2θ/θ measurement using an X-ray diffraction apparatus (D8 ADVANCE, manufactured by BRUKER). The measurement was performed using CuKα radiation under the conditions of a tube current of 40 mA and a tube voltage of 40 kV with 2θ/θ=20° to 70°.

(4) Average Particle Diameter (D50) of Seed Crystals

The average particle diameter (D50) of seed crystals was measured using a particle size distribution measurement apparatus (MT3300II), manufactured by NIKKISO Co., Ltd.).

(5) Presence or Absence of Aggregates

The presence or absence of aggregates was determined by observing particles in a plate-like alumina powder under an SEM in the same manner as in 1. (1) above. The aggregates are the state in which plate-like particles stick together while maintaining their plate shape. In this state, the particles are physically or chemically bonded. Necking, for example, is involved in this state.

2. Experimental Examples (1) Experimental Example 1

Figure 2:
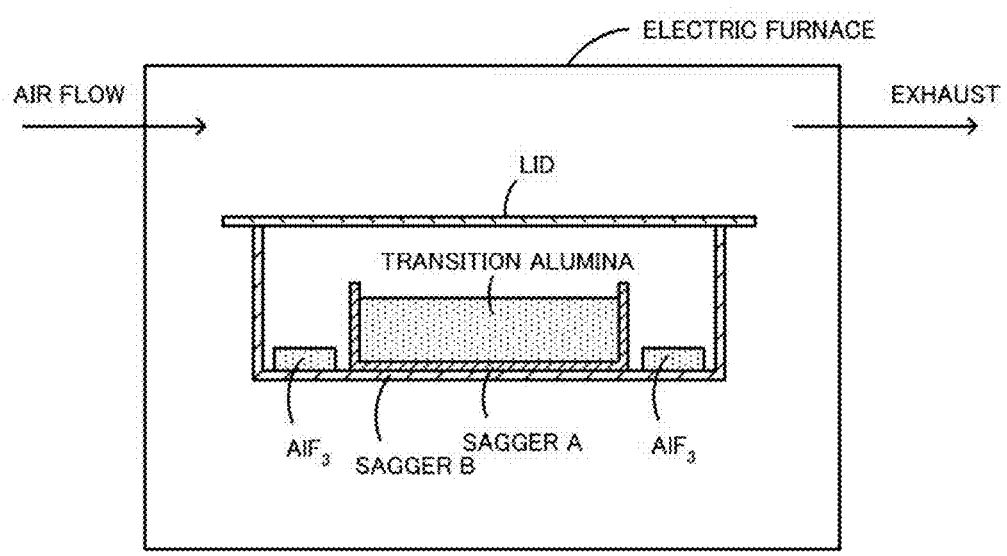
FIG. 2 is a schematic diagram of an experimental apparatus used in Experimental Example 1.

55 g of a high-purity γ-alumina powder (TM-300D, manufactured by TAIMEI CHEMICALS Co., Ltd.) was placed in a sagger A (volume: 170 cm$^3$) made of high-purity alumina with a purity of 99.98% by mass, and the sagger A was disposed in a sagger B (volume: 840 cm$^3$) made of high-purity alumina with a purity of 99.9% by mass. The purity of the high-purity γ-alumina used was evaluated, and the mass ratio of each of impurity elements other than Al, O, F, H, C, and S was found to be 10 ppm or less. 2.2 g of a high-purity AlF$_3$ powder (Cica special grade, manufactured by KANTO CHEMICAL Co., Inc.) was placed in the sagger B, and the sagger B was covered with a lid made of high-purity alumina with a purity of 99.9% by mass. Then heat treatment was performed in an electric furnace under an air flow at 900° C. for 4 hours to thereby obtain an alumina powder. The flow rate of the air was 25,000 cc/min. Although the sagger B was cover with the lid, the sagger B was not sealed. FIG. 2 shows a schematic diagram of an experimental apparatus used for the heat treatment. The mass ratio of F in the AlF$_3$, i.e., a fluoride, to the γ-alumina, i.e., a transition alumina, (=the percentage ratio of F used) was 2.7% by mass. A value obtained by dividing the mass of F in the AlF$_3$ by the volume of the sagger B (container volume) (=the mass of F/the container volume) was 0.0018 g/cm$^3$.

Figure 3:
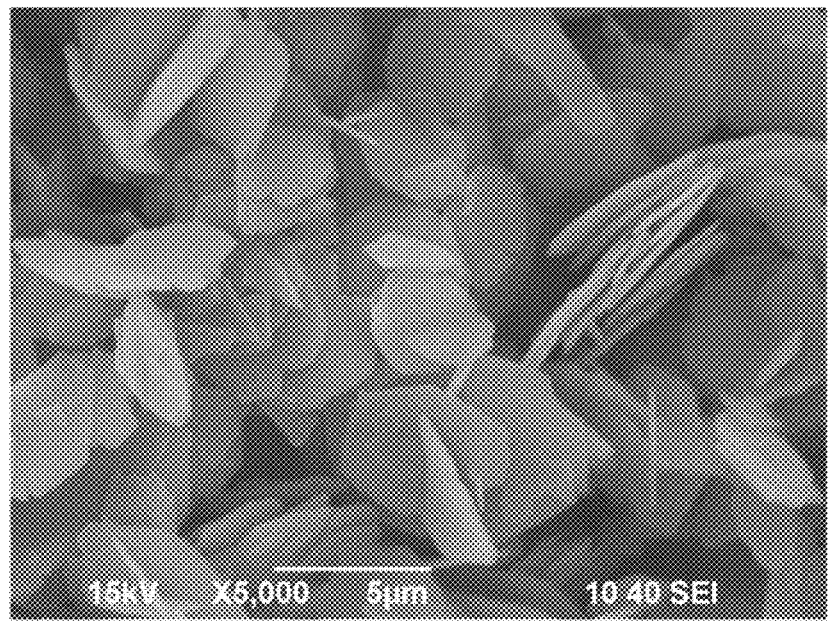
FIG. 3 is an SEM photograph of a powder obtained in Experimental Example 1.
Figure 7:
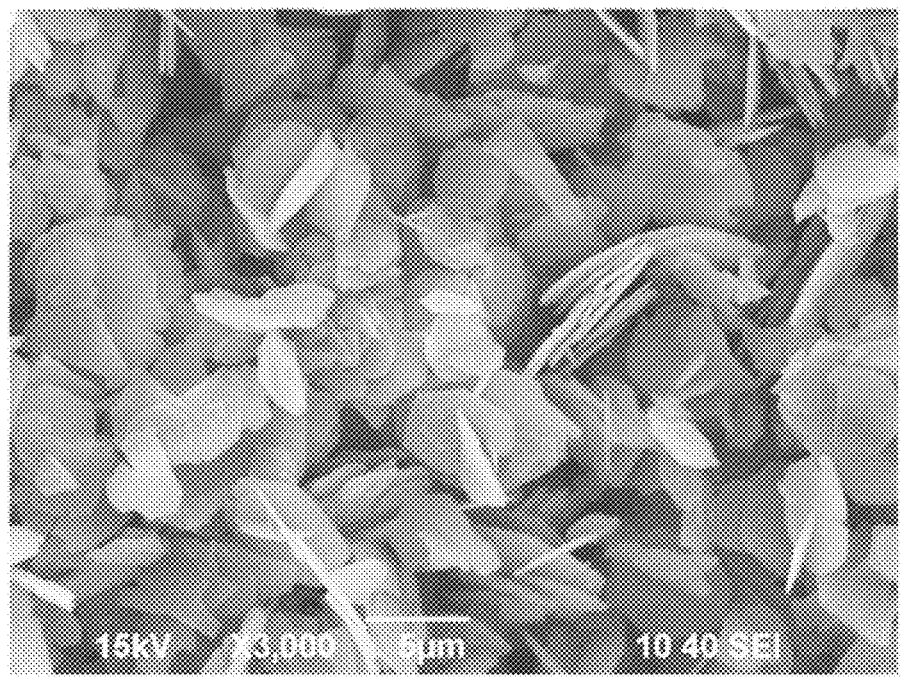
FIG. 7 is an SEM photograph of a powder obtained in Experimental Example 1 in a different field of view.

Particles contained in the obtained powder were observed under an SEM. The average particle diameter of the plate surface was 5.5 μm, and the average thickness was 0.2 μm. The aspect ratio was 27.5. Impurity elements other than Al, O, F, H, C, and S in the powder were evaluated, and the mass ratio of each of these impurity elements was 10 ppm or less. The mass ratio of F was 14,500 ppm, and the mass ratio of C was 100 ppm. The mass ratio of S was 200 ppm. Here, ppm is the ratio by mass. The crystal phase was found to be α-alumina. FIG. 3 shows an SEM photograph of the powder obtained in Experimental Example 1. FIG. 7 shows an SEM photograph of the powder obtained in Experimental Example 1 in a different field of view.

The synthesis conditions of Experimental Example 1 and the properties of the synthesized powder are shown in Table 1. The synthesis conditions of Experimental Example 2 and subsequent Experimental Examples and the properties of the powder synthesized in these Experimental Examples are also shown in Table 1. In Table 1, the "impurities" are elements other than Al, O, H, F, C, and S. The "F content" is the mass ratio of F to the total mass of a synthesized powder.

(2) Experimental Example 2

An experiment was conducted in the same manner as in Experimental Example 1 except that the heat treatment temperature was changed to 700° C. The crystal phase of the powder obtained was a mixture of γ-alumina and α-alumina.

(3) Experimental Example 3

An experiment was conducted in the same manner as in Experimental Example 1 except that the heat treatment temperature was changed to 750° C. The powder obtained was a plate-like alumina powder composed of plate-like α-alumina particles.

(4) Experimental Example 4

An experiment was conducted in the same manner as in Experimental Example 1 except that the heat treatment temperature was changed to 1,650° C. The powder obtained was a plate-like alumina powder composed of plate-like α-alumina particles.

(5) Experimental Example 5

An experiment was conducted in the same manner as in Experimental Example 1 except that the heat treatment temperature was changed to 1,700° C. The particles forming the powder obtained were α-alumina particles having an aspect ratio of only 2.5.

(6) Experimental Example 6

An experiment was conducted in the same manner as in Experimental Example 1 except that a gibbsite powder (CL-303, manufactured by Sumitomo Chemical Co., Ltd.) was used instead of the high purity γ-alumina powder. The powder obtained was a plate-like alumina powder composed of plate-like α-alumina particles. The plate-like alumina powder obtained contained 120 ppm of Fe, 310 ppm of Na, and 40 ppm of Ca, and the mass ratios of other impurity elements were 10 ppm or less.

(7) Experimental Example 7

An experiment was conducted in the same manner as in Experimental Example 1 except that a boehmite powder (VK-BG613, manufactured by Xuan Cheng Jing Rui New Material Co., Ltd.) was used instead of the plate-like γalumina powder. The powder obtained was a plate-like alumina powder composed of plate-like α-alumina particles. The plate-like alumina powder obtained contained 60 ppm of Fe and 60 ppm of Si, and the mass ratios of other impurity elements were 10 ppm or less.

(8) Experimental Example 8

An experiment was conducted in the same manner as in Experimental Example 1 except that 100 parts by mass of the high-purity γ-alumina powder and 0.17 parts by mass of a high-purity α-alumina powder (TM-DAR, manufactured by TAIMEI CHEMICALS Co., Ltd., D50=0.1 μm) used as seed crystals were dry-mixed using a mixer SMP-2 manufactured by KAWATA MFG. Co., Ltd. at 3,000 rpm for 1.2 minutes and the mixture obtained was used. The powder obtained was a plate-like alumina powder composed of plate-like α-alumina particles.

(9) Experimental Example 9

An experiment was conducted in the same manner as in Experimental Example 1 except that the amount of the high-purity $AlF_3$ powder used was changed to 0.1 g. In this case, the percentage ratio of F used was 0.12% by mass, and the mass of F/the container volume was 0.00008 $g/cm^3$. The crystal phase of the powder obtained was still γ-alumina.

(10) Experimental Example 10

An experiment was conducted in the same manner as in Experimental Example 1 except that the amount of the high-purity $AlF_3$ powder used was changed to 0.14 g. In this case, the percentage ratio of F used was 0.17% by mass, and the mass of F/the container volume was 0.0001 $g/cm^3$. The powder obtained was a plate-like alumina powder composed of plate-like α-alumina particles.

(11) Experimental Example 11

An experiment was conducted in the same manner as in Experimental Example 1 except that the amount of the high-purity $AlF_3$ powder used was changed to 10 g. In this case, the percentage ratio of F used was 12.3% by mass, and the mass of F/the container volume was 0.008 $g/cm^3$. The powder obtained was a plate-like alumina powder composed of plate-like α-alumina particles.

(12) Experimental Example 12

An experiment was conducted in the same manner as in Experimental Example 1 except that the amount of the high-purity γ-alumina powder used was changed to 1.7 g and the amount of the high-purity $AlF_3$ powder used was changed to 0.067 g. In this case, the mass of F/the container volume as 0.000054 $g/cm^3$. The crystal phase of the powder obtained was still γ-alumina.

(13) Experimental Example 13

An experiment was conducted in the same manner as in Experimental Example 1 except that the amount of the high-purity γ-alumina powder used was changed to 2.1 g and the amount of the high-purity $AlF_3$ powder used was changed to 0.084 g. In this case, the mass of F/the container volume was 0.000068 $g/cm^3$. The powder obtained was a plate-like alumina powder composed of plate-like α-alumina particles.

(14) Experimental Example 14

Figure 4:
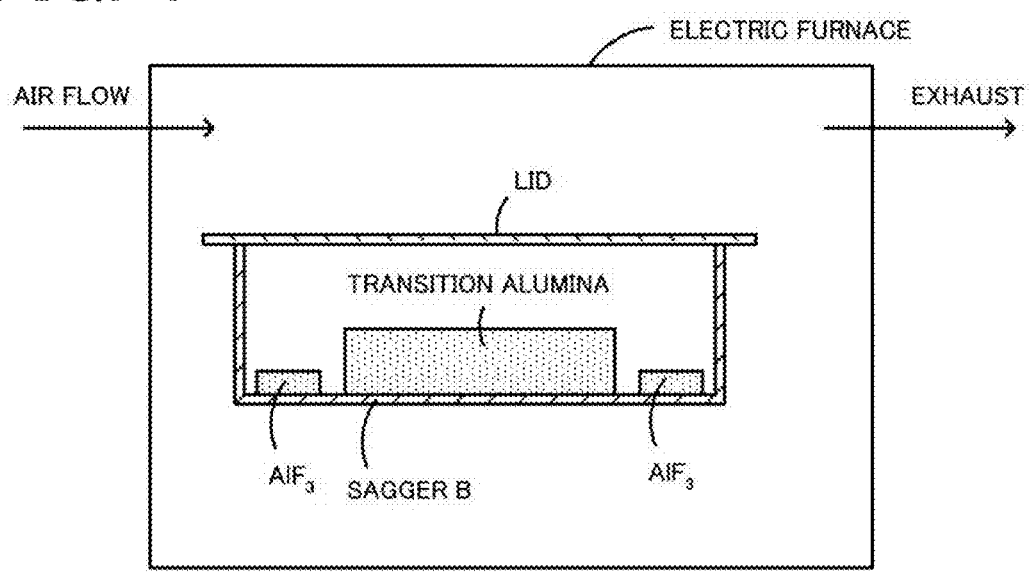
FIG. 4 is a schematic diagram of an experimental apparatus used in Experimental Example 14.

An experiment was conducted in the same manner as in Experimental Example 1 except that the sagger A was snot used and the high-purity γ-alumina powder and the high-purity $AlF_3$ powder were disposed within the sagger B so as not to come into contact with each other as shown in FIG. 4. The powder obtained was a plate-like alumina powder composed of plate-like α-alumina particles.

(15) Experimental Example 15

Figure 5:
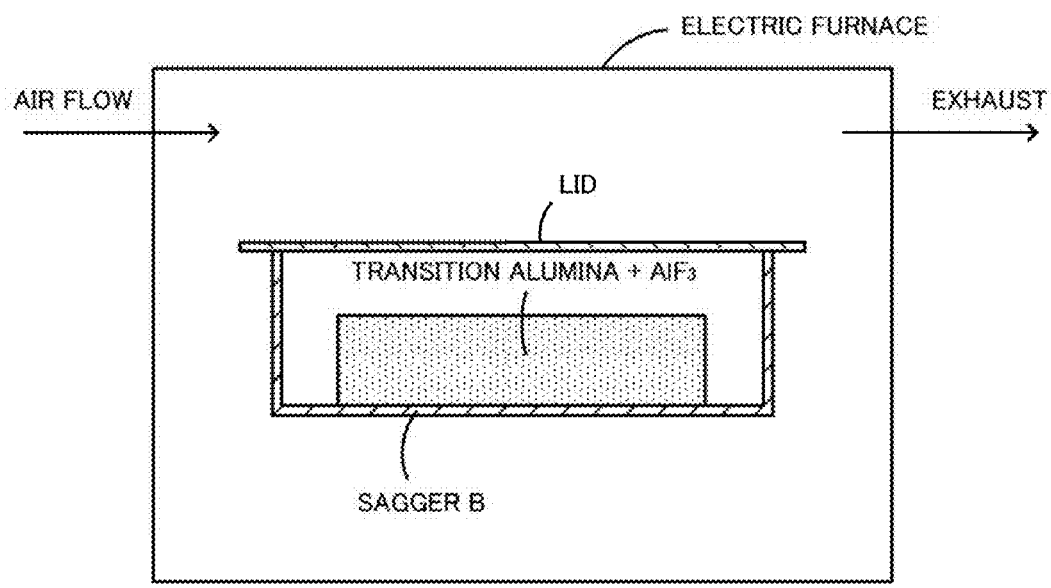
FIG. 5 is a schematic diagram of an experimental apparatus used in Experimental Example 15.
Figure 6:
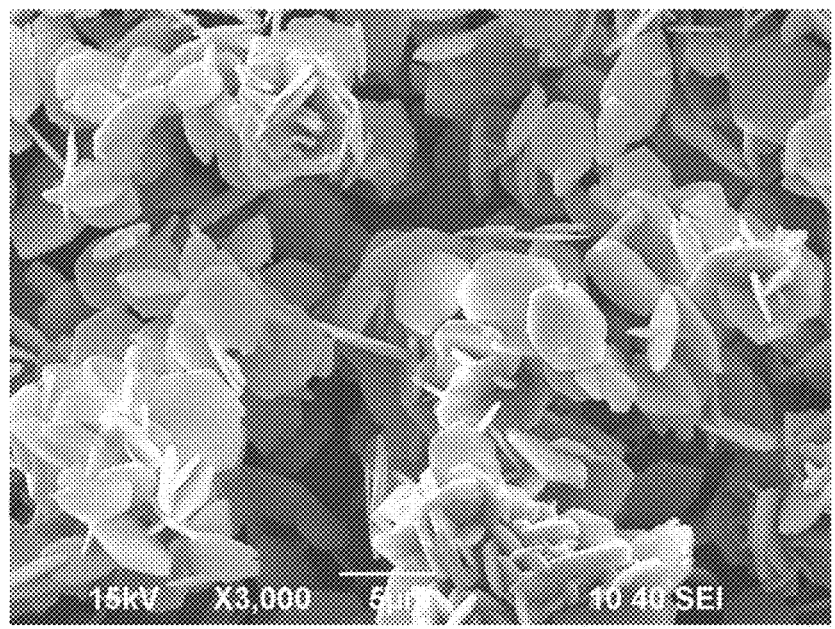
FIG. 6 is an SEM photograph of a powder obtained in Experimental Example 15.

The high purity γ-alumina powder and the high-purity $AlF_3$ powder were weighed in the same manner as in Experimental Example 1, and these powders were mixed in a pot mill for 5 hours using φ2 mm alumina balls and isopropyl alcohol serving as a solvent. The mixture obtained was placed in the sagger B, and the sagger B was covered with a lid. Then heat treatment was performed in an electric furnace under an air flow at 900° C. for 3 hours to thereby obtain an alumina powder. The flow rate of the air was 25,000 cc/min. FIG. 5 shows a schematic diagram of an experimental apparatus used for the heat treatment. The mass of F/the container volume was 0.0018 $g/cm^3$. The powder obtained was a plate-like alumina powder composed of plate-like α-alumina particles. An SEM photograph of the powder is shown in FIG. 6. As described above, even when the powder mixture obtained by mixing the transition alumina powder and the fluoride powder was used, the plate-like alumina powder was obtained. As can be seen by comparing the powder in Experimental Example 15 (see FIG. 6) and the powder in Experimental Example 1 (see FIG. 7), the degree of aggregation was higher in the powder in Experimental Example 15. This shows that a plate-like powder with less aggregates can be obtained more easily by performing the heat treatment with the transition alumina and the fluoride prevented from coming into contact with each other than by subjecting a powder mixture obtained by mixing the transition alumina powder and the fluoride powder to the heat treatment.

(16) Experimental Example 16

An experiment was conducted in the same manner as in Experimental Example 1 except that, after the heat treatment, the alumina powder was placed in a sagger made of alumina with a purity of 99.9% by mass and subjected to annealing treatment in air at 450° C. for 40 hours. The powder obtained was a plate-like alumina powder equivalent to that in Experimental Example 1.

(17) Experimental Example 17

An experiment was conducted in the same manner as in Experimental Example 16 except that the annealing was performed under the conditions of 500° C. in air for 200 hours. The powder obtained was a plate-like alumina powder composed of plate-like α-alumina particles. Specifically, the powder was a plate-like alumina powder having an aspect ratio equivalent to those in Experimental Examples 1 and 16, containing impurities in amounts equivalent to those in Experimental Examples 1 to 16, and containing a smaller amount of F.

(18) Experimental Example 18

An experiment was conducted in the same manner as in Experimental Example 16 except that the annealing was performed under the conditions of 900° C. in air for 3 hours. The powder obtained was a plate-like alumina powder composed of plate-like α-alumina particles. Specifically, the powder was a plate-like alumina powder having an aspect ratio equivalent to those in Experimental Examples 1 and 16, containing impurities in amounts equivalent to those in Experimental Examples 1 to 16, and containing a smaller amount of F.

(19) Experimental Example 19

An experiment was conducted in the same manner as in Experimental Example 16 except that the annealing was performed under the conditions of 1,350° C. in air for 43 hour. The powder obtained was a plate-like alumina powder composed of plate-like alumina powder containing impurities in amounts equivalent to those in Experimental Examples 1 to 16, having a smaller aspect ratio than those in Experimental Examples 1 and 16, and containing a very small amount of F.

(20) Experimental Example 20

An experiment was conducted in the same manner as in Experimental Example 16 except that the annealing was performed under the conditions of 1,400° C. in air for 43 hours. The powder obtained was a plate-like alumina powder composed of plate-like α-alumina particles. Specifically, the powder was plate-like alumina powder containing impurities in amounts equivalent to those in Experimental Examples 1 and 16 and a very small amount of F. However, the aspect ratio of the α-alumina particles was only 2.9.

(21) Experimental Example 21

An experiment was conducted in the same manner as in Experimental Example 1 except that the lid was not used during the heat treatment. The crystal phase of the powder obtained was still γ-alumina.

(22) Experimental Example 22

An experiment was conducted in the same manner as in Experimental Example 1 except that an AlF$_3$ powder (MB-AlF$_3$, manufactured by MORITA CHEMICAL INDUSTRIES Co., Ltd.) was used instead of the high-purity AlF$_3$ powder (Cica special grade, manufactured by DANTO CHEMICAL Co., Inc.). The powder obtained was a plate-like alumina powder composed of plate-like α-alumina particles. The purity of the AlF$_3$ powder used was evaluated. The AlF$_3$ powder contained 400 ppm of Ca and 800 ppm of Na, and mass ratios of other impurity elements were 10 ppm or less. The mass ratios of elements other than Al, O, H, F, C, and S in the powder obtained were 10 ppm or less. As described above, even when the low-purity AlF$_3$ powder was used, the high-purity plate-like alumina powder was obtained.

(23) Experimental Example 23

An experiment was conducted in the same manner as in Experimental Example 1 except that the amount of the high-purity AlF$_3$ powder used was changed to 1.21 g. In this case, the percentage ratio of F used was 1.5% by mass, and the mass of F/the container volume was 0.0010 g/cm$^3$. The powder obtained was a plate-like alumina powder composed of plate-like α-alumina particles.

(24) Experimental Example 24

An experiment was conducted in the same manner as in Experimental Example 23 except that, after the heat treatment, the alumina powder was placed in a sagger made of alumina with a purity of 99.9% by mass and subjected to annealing treatment in air at 900° C. for 3 hours. The powder obtained was a plate-like alumina powder composed of plate-like α-alumina particles. Specifically, the powder was a plate-like alumina powder having an aspect ratio equivalent to that in Experimental Example 23, containing impurities in amounts equivalent to those in Experimental Example 23, and containing a smaller amount of F.

(25) Experimental Example 25

An experiment was conducted in the same manner as in Experimental Example 16 except that the annealing was performed under the conditions of 1,150° C. in air for 43 hours. The powder obtained was a plate-like alumina powder composed of plate-like α-alumina particles. Specifically, the powder was a plate-like alumina powder having a slightly smaller aspect ratio than those in Experimental Examples 1 to 16, containing impurities in amounts equivalent to those in Experimental Examples 1 and 16, and containing a very small amount of F.

(26) Experimental Example 26

An experiment was conducted in the same manner as in Experimental Example 8 except that, after the heat treatment, the alumina powder was placed in a sagger made of alumina with a purity of 99.9% by mass and subjected to annealing treatment in air at 900° C. for 3 hours. The powder obtained was a plate-like alumina powder composed of plate-like α-alumina particles. Specifically, the powder was a plate-like alumina powder having an aspect ratio equivalent to that in Experimental Example 8, constraining impurities in amounts equivalent to those in Experimental Example 8, and containing a smaller amount of F.

(27) Experimental Example 27

An experiment was conducted in the same manner as in Experimental Example 26 except that the annealing was performed under the conditions of 1,150° C. in air for 43 hours. The powder obtained was a plate-like alumina powder composed of plate-like α-alumina particles. Specifically, the powder was a plate-like alumina powder having a slightly smaller aspect ratio than that in Experimental Example 8, containing impurities in amounts equivalent to those in Experimental Example 8, and containing a very small amount of F.

(28) Experimental Example 28

An experiment was conducted in the same manner as in Experimental Example 15 except that an $AlF_3$ powder (MB-$AlF_3$, manufactured by MORITA CHEMICAL INDUSTRIES Co., Ltd.) was used instead of the high-purity $AlF_3$ powder (Cica special grade, manufactured by KANTO CHEMICAL Co., Inc.). The powder obtained was a plate-like alumina powder composed of plate-like α-alumina particles. The plate-like alumina powder obtained contained 16 ppm of Ca and 32 ppm of Na, and the mass ratios of other impurity elements were 10 ppm or less.

TABLE 1

| Experimental Examples | Transition Alumina | Synthesis Condition ||||||||| Properties of Synthesized Powder |||||||
|---|---|---|---|---|---|---|---|---|---|---|---|---|---|---|---|---|
| | | Percentage Ratio of F Used (mass%)$^{X1}$ | Mass of F/ Container Volume (g/cm$^3$) | Seed Crystal D50 (μm) | Amount of Seed Crystal Added (mass %) | Lid | Heat Treatment Temperature (°C) | Annealing Treatment Temperature (°C) | Average Particle Diameter of Plate Surface (μm) | Average Thickness (μm) | Aspect Ratio | Crystal Phase | Impurities more than 10 ppm$^{X2}$ | F Content (ppm)$^{X3}$ | C Content (ppm)$^{X4}$ | S Content (ppm)$^{X5}$ |
| 1 | γ-Alumina | 2.7 | 0.0018 | Not Used | Not Added | Used | 900 | — | 5.5 | 0.2 | 27.5 | α-Al2O3 | Absence | 14500 | 100 | 200 |
| 2 | γ-Alumina | 2.7 | 0.0018 | Not Used | Not Added | Used | 700 | — | — | — | — | α-Al2O3 and γ-Al2O3 | Absence | — | — | — |
| 3 | γ-Alumina | 2.7 | 0.0018 | Not Used | Not Added | Used | 750 | — | 3 | 0.6 | 5.0 | α-Al2O3 | Absence | 18000 | 300 | 600 |
| 4 | γ-Alumina | 2.7 | 0.0018 | Not Used | Not Added | Used | 1650 | — | 4 | 1.2 | 3.3 | α-Al2O3 | Absence | 4000 | 80 | <100 |
| 5 | γ-Alumina | 2.7 | 0.0018 | Not Used | Not Added | Used | 1700 | — | 3.5 | 1.4 | 2.5 | α-Al2O3 | Absence | 3000 | 70 | <100 |
| 6 | Gibbsite | 2.7 | 0.0018 | Not Used | Not Added | Used | 900 | — | 3 | 0.4 | 7.5 | α-Al2O3 | Fe, Na, Ca | 15000 | 100 | 200 |
| 7 | Boehmite | 2.7 | 0.0018 | Not Used | Not Added | Used | 900 | — | 3.2 | 0.4 | 8.0 | α-Al2O3 | Fe, Si | 15500 | 100 | 200 |
| 8 | γ-Alumina | 2.7 | 0.0018 | 0.1 | 0.17 | Used | 900 | — | 3.7 | 0.3 | 12.3 | α-Al2O3 | Absence | 13500 | 100 | 200 |
| 9 | γ-Alumina | 0.12 | 0.00008 | Not Used | Not Added | Used | 900 | — | — | — | — | γ-Al2O3 | — | — | — | — |
| 10 | γ-Alumina | 0.17 | 0.0001 | Not Used | Not Added | Used | 900 | — | 0.8 | 0.25 | 3.2 | α-Al2O3 | Absence | 6200 | 100 | 200 |
| 11 | γ-Alumina | 12.3 | 0.008 | Not Used | Not Added | Used | 900 | — | 5.5 | 0.2 | 27.5 | α-Al2O3 | Absence | 40000 | 100 | 200 |
| 12 | γ-Alumina | 2.7 | 0.000054 | Not Used | Not Added | Used | 900 | — | — | — | — | γ-Al2O3 | — | — | — | — |
| 13 | γ-Alumina | 2.7 | 0.000068 | Not Used | Not Added | Used | 900 | — | 0.8 | 0.25 | 3.2 | α-Al2O3 | Absence | 6000 | 100 | 200 |
| 14 | γ-Alumina | 2.7 | 0.0018 | Not Used | Not Added | Used | 900 | — | 5.5 | 0.2 | 27.5 | α-Al2O3 | Absence | 14500 | 100 | 200 |
| 15 | γ-Alumina | 2.7 | 0.0018 | Not Used | Not Added | Used | 900 | — | 4.4 | 0.25 | 17.6 | α-Al2O3 | Absence | 20300 | 100 | 200 |
| 16 | γ-Alumina | 2.7 | 0.0018 | Not Used | Not Added | Used | 900 | 450 | 5.5 | 0.2 | 27.5 | α-Al2O3 | Absence | 14500 | 100 | 200 |
| 17 | γ-Alumina | 2.7 | 0.0018 | Not Used | Not Added | Used | 900 | 500 | 5.5 | 0.2 | 27.5 | α-Al2O3 | Absence | 10000 | 80 | <100 |
| 18 | γ-Alumina | 2.7 | 0.0018 | Not Used | Not Added | Used | 900 | 900 | 5.5 | 0.2 | 27.5 | α-Al2O3 | Absence | 6000 | 80 | <100 |
| 19 | γ-Alumina | 2.7 | 0.0018 | Not Used | Not Added | Used | 900 | 1350 | 2.8 | 0.8 | 3.5 | α-Al2O3 | Absence | 1000 | 60 | <100 |
| 20 | γ-Alumina | 2.7 | 0.0018 | Not Used | Not Added | Used | 900 | 1400 | 2.6 | 0.9 | 2.9 | α-Al2O3 | Absence | 800 | 50 | <100 |
| 21 | γ-Alumina | 2.7 | 0.0018 | Not Used | Not Added | Not Used | 900 | — | — | — | — | γ-Al2O3 | — | — | — | — |
| 22 | γ-Alumina | 2.7 | 0.0018 | Not Used | Not Added | Used | 900 | — | 5.5 | 0.2 | 27.5 | α-Al2O3 | Absence | 14500 | 100 | 200 |
| 23 | γ-Alumina | 1.5 | 0.0010 | Not Used | Not Added | Used | 900 | — | 4.2 | 0.4 | 10.5 | α-Al2O3 | Absence | 6500 | 100 | 200 |
| 24 | γ-Alumina | 1.5 | 0.0010 | Not Used | Not Added | Used | 900 | 900 | 4.2 | 0.4 | 10.5 | α-Al2O3 | Absence | 5200 | 80 | <100 |
| 25 | γ-Alumina | 2.7 | 0.0018 | Not Used | Not Added | Used | 900 | 1150 | 5 | 0.2 | 25.0 | α-Al2O3 | Absence | 1500 | 70 | <100 |
| 26 | γ-Alumina | 2.7 | 0.0018 | 0.1 | 0.17 | Used | 900 | 900 | 3.7 | 0.3 | 12.3 | α-Al2O3 | Absence | 5600 | 80 | <100 |
| 27 | γ-Alumina | 2.7 | 0.0018 | 0.1 | 0.17 | Used | 900 | 1150 | 3.5 | 0.3 | 11.7 | α-Al2O3 | Absence | 1500 | 70 | <100 |
| 28 | γ-Alumina | 2.7 | 0.0018 | Not Used | Not Added | Used | 900 | — | 4.4 | 0.25 | 17.6 | α-Al2O3 | Na, Ca | 20300 | 100 | 200 |

$^{X1}$The percentage ratio of F used indicates the mass ratio of F in the fluoride (AlF$_3$) to the transition alumina.
$^{X2}$Impurities indicate elements other than Al, O, H, F, C, and S.
$^{X3}$F content indicates the mass ratio of F to the total mass of the powder.
$^{X4}$C content indicates the mass ratio of C to the total mass of the powder.
$^{X5}$S content indicates the mass ratio of S to the total mass of the powder.

All the above-described plate-like alumina powders except for the plate-like alumina powders in Experimental Examples 2, 9, 12, 15, 21, and 28 were disintegrated using a pot mill. In each powder, the aggregates disappeared. In Experimental Examples 15 and 28, the aggregates remained. To remove the aggregates in each of the plate-like powders in Experimental Examples 15 and 28, it was necessary to enhance the disintegration conditions in the pot mill and perform the disintegration for a long time.

Among Experimental Examples 1 to 28, twenty Experimental Examples except for Experimental Examples 2, 5, 9, 12, 15, 20, 21, and 28 correspond to Examples of the present invention. In Experimental Example 20, the annealing treatment was performed after the heat treatment. The procedure before the annealing treatment is the same as that in Experimental Example 1, so Experimental Example 20 corresponds to an Example of the present invention. However, after the annealing treatment, the aspect ratio is less than 3, and therefore Experimental Example 20 is no longer the Example of the present invention. The present invention is not limited to these Examples and can be embodied in various forms so long as they belong to the technical scope of the present invention.

The present application claims priority from Japanese Patent Application No. 2015-193942 filed on Sep. 30, 2015, the entire contents of which are incorporated herein by reference.

What is claimed is:

1. A method for producing a plate-like alumina powder comprising:
preparing a fluoride and at least one transition alumina selected from the group consisting of gibbsite, boehmite, and γ-alumina;
setting the amount of the fluoride used such that the percentage ratio of F in the fluoride to the transition alumina is 0.17% by mass or more;
preparing a container having a volume such that a value obtained by dividing the mass of the F in the fluoride by the volume of the container is $6.5 \times 10^{-5}$ g/cm$^3$ or more;
placing the transition alumina and the fluoride in the container such that the transition alumina and the fluoride do not come into contact with each other;
closing the container; and
then performing heat treatment at 750 to 1,650° C. to thereby obtain a plate-like α-alumina powder,
wherein both the transition alumina and the fluoride are heated at the same temperature in a state where the transition alumina and the fluoride do not come into contact with each other.

2. The method for producing a plate-like alumina powder according to claim 1, wherein the fluoride used is a compound of Al and F.

3. The method for producing a plate-like alumina powder according to claim 1,
wherein the mass ratios of elements contained in the transition alumina and other than Al, O, F, H, C, and S are 10 ppm or less.

4. The method for producing a plate-like alumina powder according to claim 1,
wherein α-alumina particles are added as seed crystals to the transition alumina.

5. The method for producing a plate-like alumina powder according to claim 1,
wherein the container contains 99.5% by mass or more of alumina.

6. The method for producing a plate-like alumina powder according to claim 1,
wherein, after the heat treatment, the plate-like alumina is subjected to disintegration treatment.

7. The method for producing a plate-like alumina powder according to claim 1,
wherein the plate-like alumina obtained through the heat treatment is subjected to annealing treatment at 500 to 1,350° C. in air or an inert or vacuum atmosphere.

8. The method for producing a plate-like alumina powder according to claim 7,
wherein, after the annealing treatment, the plate-like alumina is subjected to disintegration treatment.

9. The method for producing a plate-like alumina powder according to claim 1,
wherein the plate-like α-alumina powder has an aspect ratio of 10.5 or more.

* * * * *

UNITED STATES PATENT AND TRADEMARK OFFICE
CERTIFICATE OF CORRECTION

PATENT NO. : 10,221,076 B2  
APPLICATION NO. : 15/446539  
DATED : March 5, 2019  
INVENTOR(S) : Hiroshi Fukui et al.

Page 1 of 1

It is certified that error appears in the above-identified patent and that said Letters Patent is hereby corrected as shown below:

On the Title Page

Foreign Application Priority Data, Item (30):
Please change: "Sep. 27, 2016 JP.....2015-193942" to -- Sep. 30, 2015 JP.....2015-193942 --

Signed and Sealed this
Twenty-third Day of April, 2019

Andrei Iancu
*Director of the United States Patent and Trademark Office*